(12) United States Patent
Liu et al.

(10) Patent No.: US 10,755,772 B1
(45) Date of Patent: Aug. 25, 2020

(54) STORAGE DEVICE AND METHODS WITH FAULT TOLERANCE CAPABILITY FOR NEURAL NETWORKS

(71) Applicant: Shanghai Cambricon Information Technology Co., Ltd, Pudong New Area (CN)

(72) Inventors: Shaoli Liu, Pudong New Area (CN); Xuda Zhou, Pudong New Area (CN); Zidong Du, Pudong New Area (CN); Daofu Liu, Pudong New Area (CN)

(73) Assignee: SHANGHAI CAMBRICON INFORMATION TECHNOLOGY CO., LTD, Pudong New Area (CN)

( * ) Notice: Subject to any disclaimer, the term of this patent is extended or adjusted under 35 U.S.C. 154(b) by 0 days.

(21) Appl. No.: 16/528,629

(22) Filed: Aug. 1, 2019

Related U.S. Application Data

(63) Continuation of application No. 16/482,710, filed on Jul. 31, 2019.

(51) Int. Cl.
| | | |
|---|---|---|
| *G11C 11/41* | (2006.01) | |
| *G11C 11/419* | (2006.01) | |
| *G11C 29/42* | (2006.01) | |
| *G06N 3/063* | (2006.01) | |
| *G11C 11/16* | (2006.01) | |

(52) U.S. Cl.
CPC .......... *G11C 11/419* (2013.01); *G06N 3/063* (2013.01); *G11C 11/1655* (2013.01); *G11C 11/1657* (2013.01); *G11C 29/42* (2013.01)

(58) Field of Classification Search
CPC ........ G06N 3/0454; G06N 3/08; G06N 3/082; G06N 20/00; G06N 3/063; G06F 9/3004; G11C 11/419; G11C 11/1655; G11C 29/42; G11C 11/1657
See application file for complete search history.

(56) References Cited

U.S. PATENT DOCUMENTS

| | | | | |
|---|---|---|---|---|
| 2006/0117239 | A1* | 6/2006 | Lin | .............. G11B 20/00 714/758 |
| 2018/0067697 | A1* | 3/2018 | Lee | .............. G06F 3/061 |
| 2018/0276534 | A1* | 9/2018 | Henry | ............ G06N 3/0481 |
| 2019/0303168 | A1* | 10/2019 | Fleming, Jr. | ...... G06F 9/3838 |

* cited by examiner

*Primary Examiner* — Ajay Ojha
(74) *Attorney, Agent, or Firm* — Getech Law LLC; Jun Ye

(57) ABSTRACT

Aspect for storage device with fault tolerance capability for neural networks are described herein. The aspects may include a first storage unit of a storage device. The first storage unit is configured to store one or more first bits of data and the data includes floating point type data and fixed point type data. The first bits include one or more sign bits of the floating point type data and the fixed point type data. The aspect may further include a second storage unit of the storage device. The second storage unit may be configured to store one or more second bits of the data. In some examples, the first storage unit may include an ECC memory and the second storage unit may include a non-ECC memory. The ECC memory may include an ECC check Dynamic Random Access Memory and an ECC check Static Random Access Memory.

15 Claims, 3 Drawing Sheets

STORAGE DEVICE AND METHODS WITH FAULT TOLERANCE CAPABILITY FOR NEURAL NETWORKS

TECHNICAL FIELD

The disclosure relates to the field of data processing, and particularly to a storage device and method, a data processing device and method, an electronic device.

BACKGROUND

Neural networks have been successfully applied. However, large-scale neural network parameters make a very high requirement on storage. On one hand, the large-scale neural network parameters require a huge storage capacity. On the other hand, access to massive neural network data may result in huge memory access energy consumption.

At present, a memory storing neural network parameters is an error correcting code (ECC) memory. The ECC memory may correct an error occurring if data is read, but the ECC memory may also bring an additional storage capacity overhead and memory access power consumption overhead. A neural network algorithm has a certain fault-tolerant capability. Storing all parameters of a neural network in an ECC memory ignores fault tolerance of the neural network and results in an additional storage overhead, computation overhead, and memory access overhead. Therefore, how to select a memory suitable for neural network processing in combination with a fault-tolerant capability of a neural network is a problem urgent to be solved.

SUMMARY

The application is intended to provide a storage device and method, a data processing method and device, and an electronic device so as to solve the above-mentioned technical problems.

An aspect of the application provides a storage device, which may include:

an accurate storage unit configured to store important bits of data; and an inaccurate storage unit configured to store unimportant bits of the data.

An embodiment of the application, the accurate storage unit adopts an ECC memory, and the inaccurate storage unit adopts a non-ECC memory.

An embodiment of the application, the data is a neural network parameter, including an input neuron, a weight, and an output neuron. The accurate storage unit may be configured to store important bits of the input neuron, important bits of the output neuron, and important bits of the weight; and the inaccurate storage unit may be configured to store unimportant bits of the input neuron, unimportant bits of the output neuron, and unimportant bits of the weight.

An embodiment of the application, the data may include floating-point type data and fixed-point type data. Sign bits and bits of an exponent part of the floating point type data are determined as the important bits, and bits of a base part are determined as the unimportant bits. Sign bits and first x bits of numerical part of the fixed point type data include the important bits, and left bits of the numerical part include the unimportant bits, where x is a positive integer more than or equal to zero and smaller than m, and m is the total number of bits of the data.

An embodiment of the application, the ECC memory may include an ECC check Dynamic Random Access Memory (DRAM) and an ECC check Static Random Access Memory (SRAM); and the ECC check SRAM adopts a 6T SRAM, a 4T SRAM, or a 3T SRAM.

An embodiment of the application, the non-ECC memory may include a non-ECC check DRAM and a non-ECC check SRAM; and the non-ECC check SRAM adopts a 6T SRAM, a 4T SRAM, or a 3T SRAM.

An embodiment of the application, a storage unit storing each bit in the 6T SRAM may include six Metal Oxide Semiconductor (MOS) transistors; a storage unit storing each bit in the 4T SRAM may include four MOS transistors; and a storage unit storing each bit in the 3T SRAM may include three MOS transistors.

An embodiment of the application, the four MOS transistors include a first MOS transistor, a second MOS transistor, a third MOS transistor, and a fourth MOS transistor. The first MOS transistor and the second MOS transistor are configured for gating, and the third MOS transistor and the fourth transistor are configured for storage, where a gate of the first MOS transistor is electrically connected with a word line (WL) and a source of the first MOS transistor is electrically connected with a bit line (BL); a gate of the second MOS transistor is electrically connected with the WL and a source of the second MOS transistor is electrically connected with another BL; a gate of the third MOS transistor is connected with a source of the fourth MOS transistor and a drain of the second MOS transistor and is connected with a working voltage source through a resistor R2, and a drain of the third MOS transistor is grounded; a gate of the fourth MOS transistor is connected with a source of the third MOS transistor and a drain of the first MOS transistor, and is connected with the working voltage source through a resistor R1, and a drain of the fourth MOS transistor is grounded; the WL may be configured to control gated access to the storage unit, and the BL may be configured to read and write the storage unit.

An embodiment of the application, the three MOS transistors include a first MOS transistor, a second MOS transistor, and a third MOS transistor. The first MOS transistor may be configured for gating, and the second MOS transistor and the third MOS transistor are configured for storage, where a gate of the first MOS transistor is electrically connected with a WL and a source of the first MOS transistor is electrically connected with a BL; a gate of the second MOS transistor is connected with a source of the third MOS transistor and is connected with the working voltage source through the resistor R2, and a drain of the second MOS transistor is grounded; a gate of the third MOS transistor is connected with a source of the second MOS transistor and a drain of the first MOS transistor and is connected with the working voltage source through the resistor R1, and a drain of the third MOS transistor is grounded; and the WL may be configured to control gated access to the storage unit, and the BL may be configured to read and write the storage unit.

Another aspect of the application provides a data processing device, which may include:

a computation unit, an instruction control unit, and the abovementioned storage device, where the storage device may be configured to receive an input instruction and a computational parameter, to store the instruction and important bits of the computational parameter in an accurate storage unit, and to store unimportant bits of the computational parameter in an inaccurate storage unit; the instruction control unit may be configured to receive the instruction stored in the storage device, to decode the instruction, and to generate control information; and the computation unit may be configured to receive the computational parameter stored in the storage device, to perform computation according to the control information, and to transfer a computational result to the storage device.

An embodiment of the application, the computation unit is a neural network processor.

An embodiment of the application, the computational parameter is a neural network parameter. The computation unit may be configured to receive an input neuron and a weight stored in the storage device, to complete neural network operation according to the control information so as to obtain an output neuron, and to transfer the output neuron to the storage device.

An embodiment of the application, the computation unit may be configured to receive important bits of an input neuron and important bits of a weight stored in the storage device for computation, or the computation unit may be configured to receive the important bits and the unimportant bits of the input neuron, and receive the important bits and the unimportant bits of the weight, and to splice the complete input neuron and weight for computation.

An embodiment of the application, the data processing device may further include: an instruction cache, arranged between the storage device and the instruction control unit and configured to store a dedicated instruction; an input neuron hierarchical cache, arranged between the storage device and the computation unit and configured to cache the input neuron, the input neuron hierarchical cache including an accurate input neuron cache and an inaccurate input neuron cache; a weight hierarchical cache, arranged between the storage device and the computation unit and configured to cache the weight, the weight hierarchical cache including an accurate weight cache and an inaccurate weight cache; and an output neuron hierarchical cache, arranged between the storage device and the computation unit and configured to cache the output neuron, the output neuron hierarchical cache including an accurate output neuron cache and an inaccurate output neuron cache.

An embodiment of the application, the data processing device may further include a DMA configured to read and write data or instructions from/into the storage device, the instruction cache, the weight hierarchical cache, the input neuron hierarchical cache, and the output neuron hierarchical cache.

An embodiment of the application, the instruction cache, the input neuron hierarchical cache, the weight hierarchical cache, and the output neuron hierarchical cache adopt 4T SRAMs or 3T SRAMs.

An embodiment of the application, the data processing device may further include a preprocessing module configured to preprocess input data and to transfer input data preprocessed to the storage device, and preprocessing may include segmentation, Gaussian filtering, binarization, regularization and normalization.

An embodiment of the application, the computation unit is a universal arithmetic processor.

Another aspect of the application provides an electronic device, which may include the abovementioned data processing device.

Another aspect of the application provides a storage method, which may include: accurately storing important bits of the data; and inaccurately storing unimportant bits of the data.

An embodiment of the application, accurately storing the important bits of the data may include: extracting the important bits of the data, and storing the important bits of the data in an ECC memory for accurate storage.

An embodiment of the application, inaccurately storing the unimportant bits in the data may include: extracting the unimportant bits of the data, and storing the unimportant bits of the data in a non-ECC memory for inaccurate storage.

An embodiment of the application, the data is a neural network parameter, including an input neuron, a weight, and an output neuron; important bits of the input neuron, important bits of the output neuron, and important bits of the weight are accurately stored; and unimportant bits of the input neuron, unimportant bits of the output neuron, and unimportant bits of the weight are inaccurately stored.

An embodiment of the application, the data may include floating point type data and fixed point type data; sign bits and bits of an exponent part of the floating point type data are determined as the important bits and bits of a base part are determined as the unimportant bits; sign bits and first x bits of numerical part of the fixed point type data include the important bits and left bits of the numerical part include the unimportant bits, where x is a positive integer more than or equal to zero and smaller than m, and m is the total number of bits of the parameter.

An embodiment of the application, the ECC memory may include an ECC check DRAM and an ECC check SRAM; and the ECC check SRAM adopts a 6T SRAM, a 4T SRAM, or a 3T SRAM.

An embodiment of the application, the non-ECC memory may include a non-ECC check DRAM and a non-ECC check SRAM; and the non-ECC check SRAM adopts a 6T SRAM, a 4T SRAM, or a 3T SRAM.

Another aspect of the application provides a data processing method, which may include:

receiving an instruction and a parameter, accurately storing the instruction and important bits of the parameter, and inaccurately storing unimportant bits of the parameter; receiving the instruction, decoding the instruction, and generating control information; and receiving the parameter, performing operation according to the control information, and storing a computational.

An embodiment of the application, the operation is neural network operation, and the parameter is a neural network parameter.

An embodiment of the application, receiving the parameter, performing the computation according to the control information, and storing the computational result may include: receiving an input neuron and a weight, completing the neural network operation according to the control information to obtain an output neuron, and storing or outputting the output neuron.

An embodiment of the application, receiving the input neuron and the weight, and completing the neural network operation according to the control information to obtain the output neuron may include: receiving important bits of the input neuron and important bits of the weight for computation; or receiving the important bits and unimportant bits of the input neuron, as well as the important bits and unimportant bits of the weight, and splicing the complete input neuron and weight for computation.

An embodiment of the application, the data processing method may further include: caching a dedicated instruction; accurately caching and inaccurately caching the input neuron; accurately caching and inaccurately caching the weight data; and accurately caching and inaccurately caching the output neuron.

An embodiment of the application, the operation is universal operation.

An embodiment of the application, before receiving the instruction and the parameter, the instruction and the important bits of the parameter are stored for accurate storage and the unimportant bits of the parameter are inaccurately stored; the data processing method may further include: preprocessing and storing input data, where preprocessing includes segmentation, Gaussian filtering, binarization, regularization, and normalization.

Another aspect of the application provides a storage unit, which is a 4T SRAM or a 3T SRAM, and may be configured to store neural network parameters.

An embodiment of the application, a storage unit storing each bit in the 4T SRAM may include four MOS transistors; and a storage unit storing each bit in the 3T SRAM may include three MOS transistors.

An embodiment of the application, the four MOS transistors include a first MOS transistor, a second MOS transistor, a third MOS transistor, and a fourth MOS transistor. The first MOS transistor and the second MOS transistor are configured for gating, and the third MOS transistor and the fourth transistor are configured for storage, where a gate of the first MOS transistor is electrically connected with a WL, and a source is electrically connected with a BL; a gate of the second MOS transistor is electrically connected with the WL and a source is electrically connected with another BL; a gate of the third MOS transistor is connected with a source of the fourth MOS transistor and a drain of the second MOS transistor and is connected with a working voltage source through a resistor R2, and a drain of the third MOS transistor is grounded; a gate of the fourth MOS transistor is connected with a source of the third MOS transistor and a drain of the first MOS transistor and is connected with the working voltage source through a resistor R1, and a drain of the fourth MOS transistor is grounded; the WL may be configured to control gated access to the storage unit, and the BL may be configured to read and write the storage unit.

An embodiment of the application, the three MOS transistors include a first MOS transistor, a second MOS transistor, and a third MOS transistor. The first MOS transistor may be configured for gating, and the second MOS transistor and the third MOS transistor are configured for storage, where a gate of the first MOS transistor is electrically connected with the WL and a source is electrically connected with the BL; a gate of the second MOS transistor is connected with a source of the third MOS transistor and is connected with the working voltage source through the resistor R2, and a drain of the second MOS transistor is grounded; a gate of the third MOS transistor is connected with a source of the second MOS transistor and a drain of the first MOS transistor and is connected with the working voltage source through the resistor R1, and a drain of the third MOS transistor is grounded. The WL may be configured to control gated access of the storage unit, and the BL may be configured to read and write the storage unit.

An embodiment of the application, the neural network parameter may include the input neuron, the weight, and the output neuron.

The storage device and method, the data processing device and method, the electronic device provided by the application at least have the following advantages.

1. The storage device of the application adopts an approximation storage technology, which may fully mine the fault-tolerant capability of the neural network. The storage device may perform approximation storage on neural parameters, in other words, the storage device may adopt accurate storage for important bits of the parameters and adopt inaccurate storage for unimportant bits. Therefore, a storage overhead and a memory access energy consumption overhead are reduced.

2. An SRAM storing weights of a neural network usually adopts a 6T SRAM. The 6T SRAM is high in stability, but large in occupied area and high in read/write power consumption. A neural network algorithm has a certain fault-tolerant capability, but the 6T SRAM may not use the fault-tolerant capability of the neural network. Therefore, for fully mining the fault-tolerant capability of the neural network in the embodiment, a 4T SRAM or 3T SRAM storage technology is adopted instead of the 6T SRAM, so as to increase a storage density of the SRAM, reduce memory access power consumption of the SRAM, and hide the defect of poor anti-noise capability of the 4T SRAM by use of the fault tolerance of the neural network algorithm.

DETAILED DESCRIPTION OF THE EMBODIMENTS

In order to make the purpose, technical solutions and advantages of the disclosure clearer, the disclosure will further be described below in combination with specific embodiments and with reference to the drawings in detail.

Figure 1:
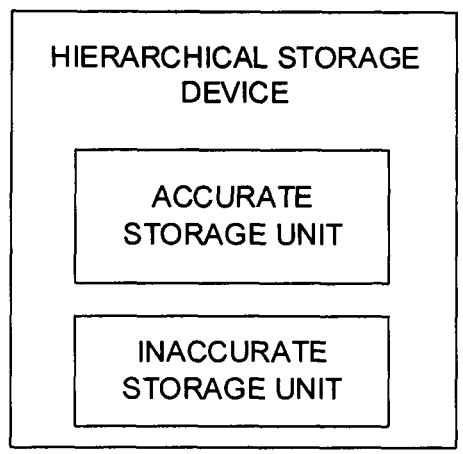
FIG. 1 is a schematic structure diagram of a hierarchical storage device according to an embodiment of the application.

FIG. 1 is a schematic structure diagram of a hierarchical storage device according to an embodiment of the application. As shown in FIG. 1, the device may include an accurate storage unit and an inaccurate storage unit. The accurate storage unit may be configured to store important bits of data. The inaccurate storage unit may be configured to store unimportant bits of the data.

The accurate storage unit adopts an ECC memory. The inaccurate storage unit adopts a non-ECC memory.

Furthermore, the data stored in the hierarchical storage device is a neural network parameter, including an input neuron, a weight, and an output neuron. The accurate storage unit stores important bits of the input neuron, the output neuron, and the weight. The inaccurate storage unit stores unimportant bits of the input neuron, the output neuron, and the weight.

Furthermore, the data stored in the hierarchical storage device may include floating point type data and fixed point type data. Sign bits and bits of an exponent part of the floating point type data are specified as the important bits, and bits of a base part is specified as the unimportant bits. Sign bits and first x bits of numerical part in the fixed point type data are specified as the important bits, and left bits of the numerical part are specified as the unimportant bits, where x is a positive integer more than or equal to zero and smaller than m, and m is the total number of bits of the fixed point type data. The important bits are stored in the ECC memory for accurate storage. The unimportant bits are stored in the non-ECC memory for inaccurate storage.

Furthermore, the ECC memory may include an ECC check DRAM and an ECC check SRAM. The ECC check SRAM adopts a 6T SRAM, and may also adopt a 4T SRAM or a 3T SRAM in another embodiment of the application.

Furthermore, the non-ECC memory may include a non-ECC check DRAM and a non-ECC check SRAM. The non-ECC check SRAM adopts a 6T SRAM, and may also adopt a 4T SRAM or a 3T SRAM in another embodiment of the application.

A unit storing each bit in the 6T SRAM consists of six MOS transistors. A unit storing each bit in the 4T SRAM consists of four MOS transistors. A unit storing each bit in the 3T SRAM consists of three MOS transistors.

An SRAM storing weights of a neural network usually adopts a 6T SRAM. The 6T SRAM is high in stability, but large in occupied area and high in read/write power consumption. A neural network algorithm has a certain fault-tolerant capability, but the 6T SRAM may not use the fault-tolerant capability of the neural network. Therefore, for fully mining the fault-tolerant capability of the neural network in the embodiment, a 4T SRAM or 3T SRAM storage technology is adopted instead of the 6T SRAM, so as to increase a storage density of the SRAM, reduce memory access power consumption of the SRAM, and hide the defect of poor anti-noise capability of the 4T SRAM by use of the fault tolerance of the neural network algorithm.

Figure 2:
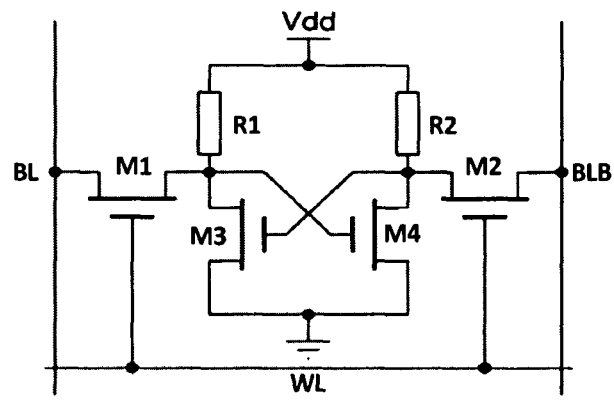
FIG. 2 is a schematic structure diagram of a storage unit of a 4T SRAM according to an embodiment of the application.

FIG. 2 is a schematic structure diagram of a storage unit of a 4T SRAM according to an embodiment of the application. As shown in FIG. 2, the storage unit of the 4T SRAM consists of four MOS transistors, for example, M1 (first MOS transistor), M2 (second MOS transistor), M3 (third MOS transistor), and M4 (fourth MOS transistor) respectively. M1 and M2 are configured for gating. M3 and M4 are configured for storage.

A gate of M1 is electrically connected with a word line WL and a source is electrically connected with a bit line BL. A gate of M2 is electrically connected with the WL and a source is electrically connected with another bit line BLB. A gate of M3 is connected with a source of M4 and a drain of M2, and is connected with a working voltage source Vdd through a resistor R2, and a drain of M3 is grounded. A gate of M4 is connected with a source of M3 and a drain of M1, and is connected with the working voltage source Vdd through a resistor R1, and a drain of M4 is grounded. The WL may be configured to control gated access of the storage unit. The BLs are configured to read and write the storage unit. During a read operation, the WL is pulled up and a bit is read from the BL. During a write operation, the WL is pulled up, and the BL is pulled up or pulled down. Since a driving capability of the BL is higher than the storage unit, an original state of the storage unit may be forcibly covered.

Figure 3:
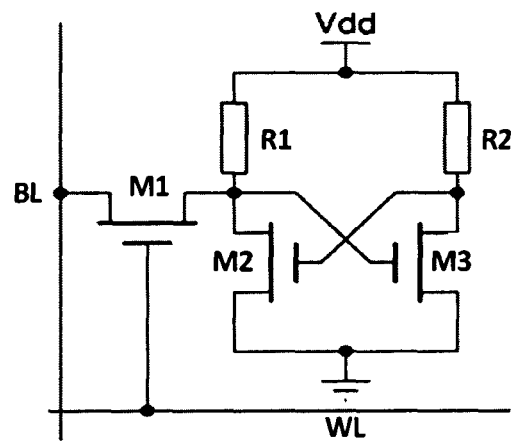
FIG. 3 is a schematic structure diagram of a storage unit of a 3T SRAM according to an embodiment of the application.

FIG. 3 is a schematic structure diagram of a storage unit of a 3T SRAM according to an embodiment of the application. As shown in FIG. 3, the storage unit of the 3T SRAM consists of three MOS transistors, for example, M1 (first MOS transistor), M2 (second MOS transistor), and M3 (third MOS transistor) respectively. M1 may be configured for gating. M2 and M3 are configured for storage.

A gate of M1 is electrically connected with a WL and a source is electrically connected with a BL. A gate of M2 is connected with a source of M3 and is connected with the working voltage source Vdd through the resistor R2, and a drain of M2 is grounded. A gate of M3 is connected with a source of M2 and a drain of M1, and is connected with the working voltage source Vdd through the resistor R1, and a drain of M3 is grounded. The WL may be configured to control gated access of the storage unit. The BL may be configured to read and write the storage unit. During a read operation, the WL is pulled up and a bit is read from the BL. During a write operation, the WL is pulled up, and the BL is pulled up or pulled down. Since the driving capability of the BL is higher than the storage unit, an original state of the storage unit may be forcibly covered.

The storage device of the application adopts an approximation storage technology, which may fully mine the fault-tolerant capability of the neural network. The storage device may perform approximation storage on neural parameters, in other words, the storage device may adopt accurate storage for important bits of the parameters and adopt inaccurate storage for unimportant bits. Therefore, a storage overhead and a memory access energy consumption overhead are reduced.

Figure 4:
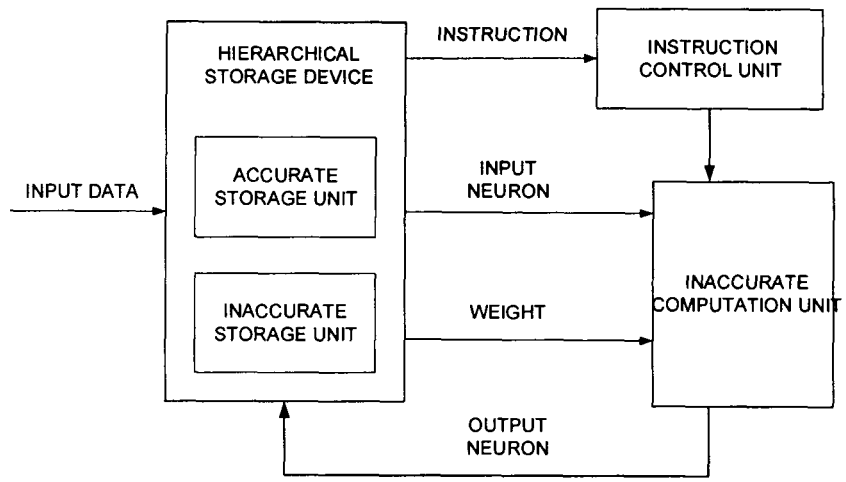
FIG. 4 is a schematic structure diagram of a data processing device according to an embodiment of the application.

An embodiment of the application provides a data processing device. The device is an acceleration device corresponding to the approximation storage technology. FIG. 4 is a schematic structure diagram of a data processing device according to an embodiment of the application. The data processing device may include an inaccurate computation unit, an instruction control unit, and the abovementioned hierarchical storage device.

The hierarchical storage device may be configured to receive an instruction and a computational parameter, to store important bits of the computational parameter and the instruction in an accurate storage unit, and to store unimportant bits of the computational parameter in an inaccurate storage unit.

The instruction control unit may be configured to receive the instruction in the hierarchical storage device, to decode the instruction, and to generate control information to control the inaccurate computation unit for a computational operation.

The inaccurate computation unit may be configured to receive the computational parameter in the hierarchical storage device, to perform computation according to the control information, and to transfer a computational result to the hierarchical storage device for storage or output.

Furthermore, the inaccurate computation unit may be a neural network processor. Furthermore, the computational parameter may be a neural network parameter. The hierarchical storage device may be configured to store a neuron, weight, and instruction of a neural network, to store important bits of the neuron, important bits of the weight, and the instruction in the accurate storage unit, and to store unimportant bits of the neuron and unimportant bits of the weight in the inaccurate storage unit. The inaccurate computation unit may be configured to receive the input neuron and weight in the hierarchical storage device, to complete neural network operation according to the control information to obtain an output neuron, and to retransfer the output neuron to the hierarchical storage device for storage or output.

Furthermore, the inaccurate computation unit may adopt two computation modes. (1) The inaccurate computation unit directly receives the important bits of the input neuron and the important bits of the weight from the accurate storage unit of the hierarchical storage device for computation. (2) The inaccurate computation unit receives the important bits and the unimportant bits and splices the complete input neuron and weight for computation. The important bits and unimportant bits of the input neuron and the weight are spliced if being read from the storage unit.

Figure 5:
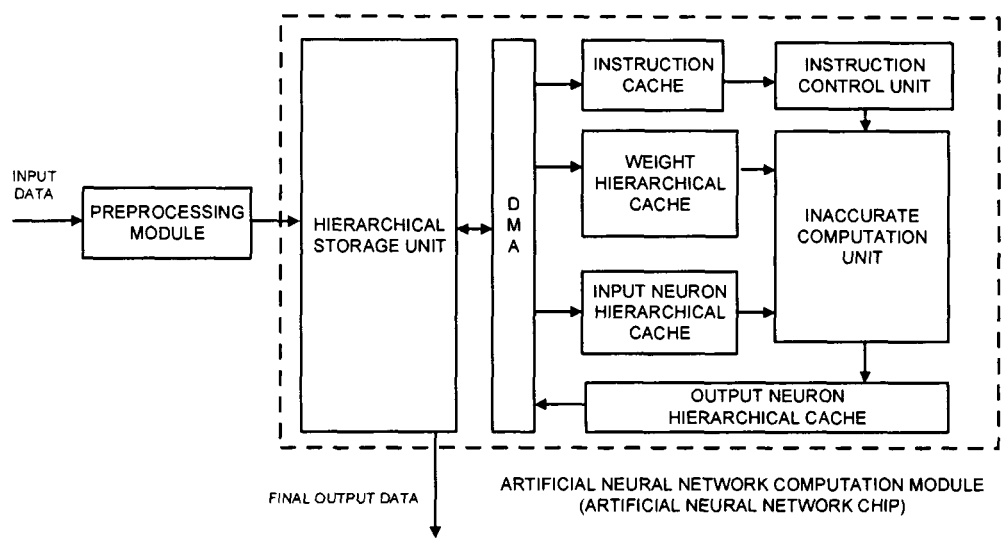
FIG. 5 is a schematic structure diagram of another data processing device according to an embodiment of the application.

Furthermore, as shown in FIG. 5, the data processing device further may include a preprocessing module configured to preprocess input of original data and to transfer it to the storage device. Preprocessing may include segmentation, Gaussian filtering, binarization, regularization, normalization, and the like.

Furthermore, the data processing device further may include an instruction cache, an input neuron hierarchical cache, a weight hierarchical cache, and an output neuron hierarchical cache. The instruction cache is arranged between the hierarchical storage device and the instruction control unit configured to store a dedicated instruction. The input neuron hierarchical cache is arranged between the storage device and the inaccurate computation unit configured to cache the input neuron. The input neuron hierarchical cache may include an accurate input neuron cache and an inaccurate input neuron cache which cache the important bits and unimportant bits of the input neuron respectively. The weight hierarchical cache is arranged between the storage device and the inaccurate computation unit configured to cache weight data. The weight hierarchical cache may include an accurate weight cache and an inaccurate weight cache which cache the important bits and unimportant bits of the cache respectively. The output neuron hierarchical cache is arranged between the storage device and the inaccurate computation unit configured to cache the output neuron. The output neuron hierarchical cache may include an accurate output neuron cache and an inaccurate output neuron cache which cache important bits and unimportant bits of the output neuron respectively.

Furthermore, the data processing device further may include a DMA configured to read and write data or instructions from/into the storage device, the instruction cache, the weight hierarchical cache, the input neuron hierarchical cache, and the output neuron hierarchical cache.

Furthermore, the instruction cache, the input neuron hierarchical cache, the weight hierarchical cache, and the output neuron hierarchical cache all adopt 4T SRAMs or 3T SRAMs.

Furthermore, the inaccurate computation unit may include, but is not limited to, three parts. A first part may be a multiplier, a second part may be an adder tree, and a third part may be an active function unit. The first part multiplies input data 1 (in1) and input data 2 (in2) to obtain a multiplied output (out), and a process is illustrated by out=in1×in2. The second part adds the input data in1 step by step through the adder tree to obtain the output data (out), in which in1 may be a vector with a length N and N may be larger than 1, and a process is illustrated by out=in1[1]+in1[2]+ . . . +in1[N]. Or, the input data (in1) is accumulated through the adder tree and then is added with the input data (in2) to obtain the output data (out), and a process is illustrated by out=in1[1]+in1[2]+ . . . +in1[N]+in2. Or, the input data (int) and the input data (in2) are added to obtain the output data (out), and a process is illustrated by out=in1+in2. The third part performs computation on the input data (in) through an active function to obtain active output data (out), a process is illustrated by out=active(in), where the active function may be sigmoid, tanh, relu, softmax, and the like. Besides an activation operation, the third part may perform computation (f) on the input data (in) through another nonlinear function to obtain the output data (out), and a process is illustrated by out=f(in).

The inaccurate computation unit may further include a pooling unit. The pooling unit may be configured to perform pooling computation on the input data (in) to obtain output data (out), and a process is illustrated by out=pool(in), where pool is the pooling computation. The pooling computation may include, but is not limited to, average pooling, maximum pooling, and median pooling. The input data in is data in a pooling core related to output out.

The computation performed by the inaccurate computation unit may include a few parts. The first part multiplies the input data 1 and the input data 2 to obtain multiplied data. The second part performs the adder tree computation, and may be configured to add the input data 1 through the adder tree step by step, or to add the input data 1 which is added through the adder tree step by step and the input data 2 to obtain output data. The third part performs the active function computation on the input data through the active function to obtain the output data. The computation of the abovementioned parts may be freely combined, so that computation of various functions can be implemented.

The data processing device of the application may fully use the approximation storage technology, fully mine a fault-tolerant capability of a neural network, and reduce a computation amount of the neural network and memory access of the neural network, thereby reducing computation energy consumption and memory access energy consumption. A dedicated single instruction multiple data (SIMD) instruction for a multilayer artificial neural network operation and a customized computation unit are adopted, so that the problems of poor computational performance of a CPU and a GPU and high front-end decoding overhead are solved, and support to a multilayer artificial neural network operation algorithm is effectively improved. A dedicated inaccurate storage on-chip cache for the multilayer artificial neural network operation algorithm is adopted, so that importance of input neurons and weight data is fully mined, repeated reading of these data from the memory is avoided, a memory access bandwidth is reduced, and performance bottleneck problems brought by a memory bandwidth to the multilayer artificial neural network operation and a training algorithm of the multilayer artificial neural network operation are solved.

The above is only exemplary description and not intended to limit the application. The data processing device may include a non-neural network processor, for example, a universal arithmetic processor. A corresponding universal operational instruction and data are involved in a universal operation, for example, scalar arithmetic computation and scalar logical computation. The universal arithmetic processor may include, but is not limited to, for example, one or more multipliers and one or more adders and performs basic computations such as addition and multiplication.

Figure 6:
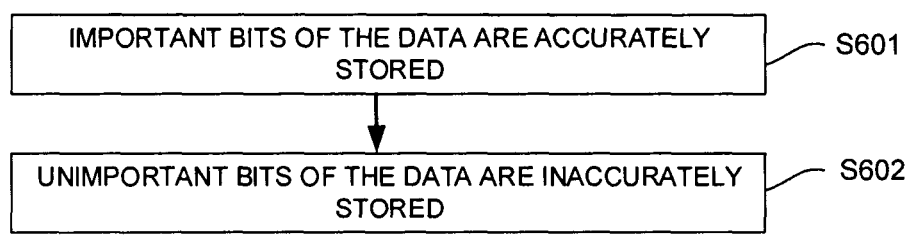
FIG. 6 is a flowchart of a data storage method according to an embodiment of the application.

Another embodiment of the application provides a data storage method. An approximation storage manner is adopted for hierarchical storage of data. FIG. 6 is a flowchart of a data storage method according to an embodiment of the application. The method may include the following:

in S601, accurately storing important bits of the data;

in S602, inaccurately storing unimportant bits of the data.

In one implementation, the data storage method may include the following:

extracting the important bits and unimportant bits of the data;

accurately storing the important bits of the data are in an ECC memory;

inaccurately storing the unimportant bits of the data in a non-ECC memory.

In the embodiment, the stored data is a neural network parameter. Bits representing the neural network parameter are divided into important bits and unimportant bits. For example, a parameter of a neural network may include totally m bits, where n of the m bits are important bits and (m-n) of the m bits are unimportant bits, in which m may be an integer larger than zero and n may be an integer larger than zero and less than or equal to m.

The neural network parameter may include an input neuron, a weight, and an output neuron. Important bits of the input neuron, important bits of the output neuron, and important bits of the weight are accurately stored. Unimportant bits of the input neuron, unimportant bits of the output neuron, and unimportant bits of the weight are inaccurately stored.

The data may include floating point type data and fixed point type data. Sign bits and bits of an exponent part in the floating point type data are determined as the important bits and bits of a base part are determined as the unimportant bits. Sign bits and first x bits of numerical part in the fixed point type data are determined as the important bits and left bits of the numerical part are determined as the unimportant bits, in which x may be a positive integer more than or equal to zero and smaller than m and m may be the total number of bits of the parameter.

The ECC memory may include an ECC check SRAM and an ECC check DRAM. The non-ECC memory may include a non-ECC check SRAM and a non-ECC check DRAM. The ECC check SRAM and the non-ECC check SRAM adopt 6T SRAMs, and may also adopt 4T SRAMs or 3T SRAMs in another embodiment of the application.

Figure 7:
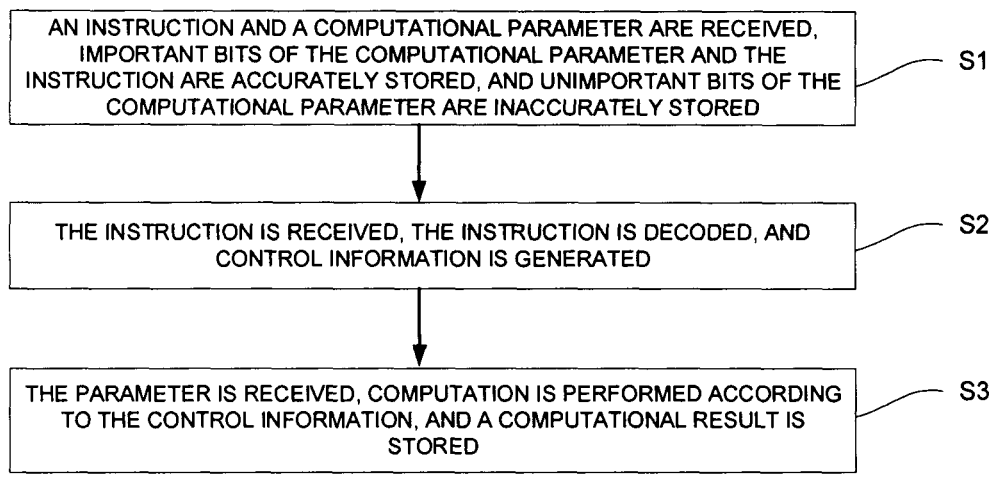
FIG. 7 is a flowchart of a data processing method according to an embodiment of the application.

Another embodiment of the application provides a data processing method. FIG. 7 is a flowchart of a data processing method according to an embodiment of the application. As shown in FIG. 7, the method may include the following:

in S1, receiving an instruction and a computational parameter, accurately storing important bits of the computational parameter and the instruction, inaccurately storing and unimportant bits of the computational parameter;

in S2, receiving the instruction, decoding the instruction, and generating control information;

in S3, receiving the parameter, performing operation according to the control information, and storing a computational result.

The operation is neural network operation. The parameter is a neural network parameter including an input neuron, a weight, and an output neuron.

S3 further may include: receiving the input neuron and the weight, completing the neural network operation according to the control information to obtain the output neuron, and storing or outputting the output neuron.

Furthermore, receiving the input neuron and the weight and completing the neural network operation according to the control information to obtain the output neuron may include: receiving important bits of the input neuron and important bits of the weight for computation; or receiving the important bits and the unimportant bits of the input neuron, as well as the important bits and unimportant bits of the weight, and splicing the complete input neuron and weight for computation.

Furthermore, the method may further include the following: caching a dedicated instruction; accurately caching and inaccurately caching the input neuron; accurately caching and inaccurately caching weight data; and accurately caching and inaccurately caching the output neuron.

Furthermore, before S1, the method may further include: preprocessing the parameter.

Another embodiment of the application provides a storage unit. The storage unit may be configured as a 4T SRAM or a 3T SRAM, to store a neural network parameter. A specific structure of the 4T SRAM refers to the structure shown in FIG. 2. A specific structure of the 3T SRAM refers to the structure shown in FIG. 3. No more descriptions will be made herein.

It is to be noted that each unit or module may be a circuit, including a digital circuit, an analogue circuit, and the like. Physical implementation of a structure of each unit or module may include, but is not limited to, a physical device, which may include, but is not limited to, a transistor, a memristor, and the like. The chip or the neural network processor may be any proper hardware processor, for example, a CPU, a GPU, an FPGA, a digital signal processor (DSP), and an ASIC. The storage unit may be any proper magnetic storage medium or magneto-optic storage medium, for example, a resistive random access memory (RRAM), a DRAM, a SRAM, an enhanced dynamic random access memory (EDRAM), a high bandwidth memory (HBM), and a hybrid memory cube (HMC), and the like.

The application may be applied to numerous universal or dedicated computer system environments or configurations, for example, a personal computer (PC), a server computer, a handheld device or a portable device, a tablet device, a multiprocessor system, a microprocessor-based system, a set-top box, a programmable consumer electronic device, a network PC, a minicomputer, a large computer, and a distributed computation environment including any abovementioned system or device.

According to an embodiment, the application provides a chip, which may include the abovementioned computation device. The chip may simultaneously perform various types of computation on a weight and an input neuron to achieve computational diversity. In addition, a dedicated on-chip cache for the multilayer artificial neural network operation algorithm is adopted, so that reusability of the input neurons and the weight data is fully mined, repeated reading of these data from the memory is avoided, a memory access bandwidth is reduced, and the problem that a memory bandwidth becomes a performance bottleneck of multilayer artificial neural network operation and a training algorithm of the multilayer artificial neural network operation is solved.

An embodiment of the application provides a chip package structure, which may include the abovementioned neural network processor.

An embodiment of the application provides a board card, which may include the abovementioned chip package structure.

An embodiment of the application provides an electronic device, which may include the abovementioned board card.

The electronic device may include, but is not limited to, a robot, a computer, a printer, a scanner, a tablet computer, an intelligent terminal, a mobile phone, an automobile data recorder, a navigator, a sensor, a webcam, a cloud server, a camera, a video camera, a projector, a watch, an earphone, a mobile storage, a wearable device, a transportation means, a household electrical appliance, and a medical device.

The transportation means may include an airplane, a ship, and/or a vehicle. The household electrical appliance may include a television, an air conditioner, a microwave oven, a refrigerator, an electric rice cooker, a humidifier, a washing machine, an electric lamp, a gas cooker, and a range hood. The medical device may include a nuclear magnetic resonance spectrometer, a B-ultrasonic scanner, and/or an electrocardiograph.

Those of ordinary skill in the art may realize that the units and algorithm steps of each example described in combination with the embodiments of the application may be implemented by electronic hardware, computer software, or a combination of the two. For clearly describing exchangeability of the hardware and the software, compositions and steps of each example have been generally described in the descriptions according to functions. Whether these functions are performed in a hardware or software manner depends on specific applications and design constraints of the technical solutions. Professionals may realize the described functions for each specific application by use of different methods, but such realization shall fall within the scope of the application.

Those skilled in the art may clearly know that, for convenient and brief description, working processes of terminals and units described above may refer to the corresponding processes in the method embodiments and will not be elaborated herein.

In the embodiments provided by the application, it is to be understood that the disclosed terminals and methods may be implemented in other manners. For example, the device embodiment described above is only schematic. For example, division of the units is only logical function division and another division manner may be adopted during practical implementation. For example, multiple units or components may be combined or integrated into another system or some characteristics may be neglected or not performed. In addition, coupling, direct coupling, or communication connection between each displayed or discussed component may be indirect coupling or communication connection, implemented through some interfaces, devices, or units, and may be electrical, mechanical, or in other forms.

The units described as separate parts may or may not be physically separated. Parts displayed as units may or may not be physical units, and for example, may be located in the same place, or may also be distributed in multiple network units. Part or all of the units may be selected to achieve the purpose of the solutions of the embodiments of the application according to a practical requirement.

In addition, each functional unit in the embodiments of the application may be integrated into a processing unit, each unit may also physically exist independently, and two or more units may also be integrated into one unit. The integrated unit may be implemented in the form of hardware or a software functional unit.

If being implemented in the form of a software functional unit and sold or used as an independent product, the integrated unit may be stored in a computer-readable storage medium. Based on such an understanding, all or part of the technical solutions may be embodied in form of software product. The computer software product is stored in a storage medium, including a plurality of instructions configured to enable a computer device (which may be a PC, a server, a network device, or the like) to perform all or part of the operations of the method in each embodiment of the application. The storage medium may include various media capable of storing program codes such as a U disk, a mobile hard disk, a read-only memory (ROM), a random access memory (RAM), a magnetic disk, or an optical disk.

It is to be noted that implementation modes which are not shown or described in the drawings or the body of the specification are all in forms known to those of ordinary skill in the art and are not described in detail. In addition, the definitions about each component and method are not limited to each specific structure, shape, or manner mentioned in the embodiments, to which those of ordinary skill in the art may make simple modifications or replacements.

The purposes, technical solutions, and beneficial effects of the application are further described above with the specific embodiments in detail. It is to be understood that the above is only the specific embodiment of the application and not intended to limit the application. Any modifications, equivalent replacements, improvements, and the like made within the spirit and principle of the application shall fall within the scope of protection of the application.

What is claimed:

1. A data processing device, comprising:
   a first storage unit of a storage device,
      wherein the first storage unit is configured to store one or more first bits of data,
      wherein the data includes floating point type data and fixed point type data, and
      wherein the first bits include one or more sign bits of the floating point type data and the fixed point type data,
      wherein the first storage unit includes an ECC memory, and the second storage unit includes a non-ECC memory, and
      wherein the ECC memory comprises an ECC check Dynamic Random Access Memory and an ECC check Static Random Access Memory, and the ECC check Static Random Access Memory adopts a 6T Static Random Access Memory, a 4T Static Random Access Memory, or a 3T Static Random Access Memory; and
   a second storage unit of the storage device, wherein the second storage unit is configured to store one or more second bits of the data.

2. The data processing device of claim 1, wherein
   the non-ECC memory comprises a non-ECC check Dynamic Random Access Memory and a non-ECC check Static Random Access Memory;
   the non-ECC check Static Random Access Memory adopts a 6T Static Random Access Memory, a 4T Static Random Access Memory, or a 3T Static Random Access Memory.

3. The data processing device of claim 1, wherein
   a storage unit storing each bit in the 6T Static Random Access Memory comprises six Metal Oxide Semiconductor transistors;
   a storage unit storing each bit in the 4T Static Random Access Memory comprises four Metal Oxide Semiconductor transistors;
   a storage unit storing each bit in the 3T Static Random Access Memory comprises three Metal Oxide Semiconductor transistors.

4. The data processing device of claim 3, wherein the four Metal Oxide Semiconductor transistors in the 4T Static Random Access Memory comprise a first Metal Oxide Semiconductor transistor, a second Metal Oxide Semiconductor transistor, a third Metal Oxide Semiconductor transistor, and a fourth Metal Oxide Semiconductor transistor.

5. The data processing device of claim 3, wherein the three Metal Oxide Semiconductor transistors in the 3T Static Random Access Memory comprise a first Metal Oxide Semiconductor transistor, a second Metal Oxide Semiconductor transistor, and a third Metal Oxide Semiconductor transistor, the first Metal Oxide Semiconductor transistor is configured for gating, and the second Metal Oxide Semiconductor transistor and the third Metal Oxide Semiconductor transistor are configured for storage.

6. The data processing device of claim 4, wherein the first Metal Oxide Semiconductor transistor and the second Metal Oxide Semiconductor transistor are configured for gating, and the third Metal Oxide Semiconductor transistor and the fourth transistor are configured for storage.

7. The data processing device of claim 6, wherein a gate of the first Metal Oxide Semiconductor transistor is electrically connected with a word line and a source is electrically connected with a bit line.

8. The data processing device of claim 7, wherein a gate of the second Metal Oxide Semiconductor transistor is electrically connected with the word line and a source is electrically connected with another bit line.

9. The data processing device of claim 8, wherein a gate of the third Metal Oxide Semiconductor transistor is connected with a source of the fourth Metal Oxide Semiconductor transistor and a drain of the second Metal Oxide Semiconductor transistor and is connected with a working voltage source through a resistor R2, and a drain of the third Metal Oxide Semiconductor transistor is grounded.

10. The data processing device of claim 9, wherein a gate of the fourth Metal Oxide Semiconductor transistor is connected with a source of the third Metal Oxide Semiconductor transistor and a drain of the first Metal Oxide Semiconductor transistor and is connected with the working voltage source through a resistor R1, and a drain of the fourth Metal Oxide Semiconductor transistor is grounded.

11. The data processing device of claim 10, wherein the word line is configured to control gated access to the storage unit, and the bit line is configured to read and write the storage unit.

12. The data processing device of claim 5, wherein a gate of the first Metal Oxide Semiconductor transistor is electrically connected with a word line and a source is electrically connected with a bit line.

13. The data processing device of claim 12, wherein a gate of the second Metal Oxide Semiconductor transistor is connected with a source of the third Metal Oxide Semiconductor transistor and is connected with the working voltage source through the resistor R2, and a drain of the second Metal Oxide Semiconductor transistor is grounded.

14. The data processing device of claim 13, wherein a gate of the third Metal Oxide Semiconductor transistor is connected with a source of the second Metal Oxide Semiconductor transistor and a drain of the first Metal Oxide Semiconductor transistor and is connected with the working voltage source through the resistor R1, and a drain of the third Metal Oxide Semiconductor transistor is grounded.

15. The data processing device of claim 14, wherein the word line is configured to control gated access to the storage unit, and the bit line is configured to read and write the storage unit.

* * * * *